(12) United States Patent
Miyashita et al.

(10) Patent No.: US 8,027,171 B2
(45) Date of Patent: Sep. 27, 2011

(54) FEEDING STRUCTURE OF ELECTROSTATIC CHUCK, METHOD FOR PRODUCING THE SAME, AND METHOD FOR REGENERATING FEEDING STRUCTURE OF ELECTROSTATIC CHUCK

(75) Inventors: Kinya Miyashita, Tokyo (JP); Yoshihiro Watanabe, Tokyo (JP)

(73) Assignee: Creative Technology Corporation, Tokyo (JP)

( * ) Notice: Subject to any disclaimer, the term of this patent is extended or adjusted under 35 U.S.C. 154(b) by 388 days.

(21) Appl. No.: 12/441,767

(22) PCT Filed: Sep. 19, 2006

(86) PCT No.: PCT/JP2006/318509
§ 371 (c)(1),
(2), (4) Date: Mar. 18, 2009

(87) PCT Pub. No.: WO2008/035395
PCT Pub. Date: Mar. 27, 2008

(65) Prior Publication Data
US 2010/0065300 A1    Mar. 18, 2010

(51) Int. Cl.
*H05K 3/14* (2006.01)
(52) U.S. Cl. ............. 361/794; 174/11 OR; 361/234; 361/235; 29/33 M; 29/753; 29/566.4
(58) Field of Classification Search ............. 361/234, 361/235, 794; 174/110 R; 313/631; 29/33 M, 29/753, 751, 566.4; 219/549
See application file for complete search history.

(56) References Cited

U.S. PATENT DOCUMENTS

| 5,634,266 | A | * | 6/1997 | Sherstinsky et al. ............. 29/825 |
| 5,978,202 | A | * | 11/1999 | Wadensweiler et al. ...... 361/234 |
| 6,320,736 | B1 | * | 11/2001 | Shamouilian et al. ........ 361/234 |

FOREIGN PATENT DOCUMENTS

| JP | 7-161803 A | 6/1995 |
| JP | 10-189696 | 7/1998 |
| JP | 11-074336 | 3/1999 |
| JP | 2001-308165 A | 11/2001 |
| JP | 2003-179127 | 6/2003 |
| JP | 2007-27315 A | 2/2007 |

* cited by examiner

*Primary Examiner* — Tuan T Dinh
*Assistant Examiner* — Hung Dang
(74) *Attorney, Agent, or Firm* — Birch, Stewart, Kolasch & Birch, LLP

(57) ABSTRACT

Provided is a power feeding structure of an electrostatic chuck including a lower insulation layer, an electrode layer and a surface insulation dielectric layer formed on an upper surface side of a metal substrate in order from the metal substrate, in which the lower insulation layer, the electrode layer and the surface insulation dielectric layer are not cracked easily. The power feeding structure of an electrostatic chuck includes: a through hole formed through an upper surface and a lower surface of the metal substrate; a power feeding terminal disposed in the through hole for supplying a voltage supplied from a lower surface side of the metal substrate to the electrode layer formed on the upper surface side of the metal substrate; and an insulation holding member formed of an electric insulating material for insulating an inner wall of the through hole from the power feeding terminal and for holding the power feeding terminal, and the power feeding terminal includes a power feeding end portion that protrudes to the upper surface side of the metal substrate, and a tip of the power feeding end portion is positioned at the electrode layer side with respect to an interface between the electrode layer and the lower insulation layer, and on and under an interface between the electrode layer and the surface insulation dielectric layer.

9 Claims, 4 Drawing Sheets

(a)

(b)

FEEDING STRUCTURE OF ELECTROSTATIC CHUCK, METHOD FOR PRODUCING THE SAME, AND METHOD FOR REGENERATING FEEDING STRUCTURE OF ELECTROSTATIC CHUCK

TECHNICAL FIELD

The present invention relates to a power feeding structure for feeding power to an electrode layer of an electrostatic chuck, which is provided to a plasma treatment apparatus, an electron beam lithography, an ion implantation apparatus or the like that is used for a manufacturing process of a semiconductor device, or to an ion doping apparatus or the like that is used for manufacturing a liquid crystal panel.

BACKGROUND ART

As to the plasma treatment apparatus, the electron beam lithography apparatus, the ion implantation apparatus or the like that is used for the manufacturing process of a semiconductor device, or the ion doping apparatus or the like that is used for manufacturing a liquid crystal panel, it is required to securely hold a semiconductor wafer or a glass substrate that is an object to be treated without damaging the semiconductor wafer or the glass substrate. In particular, since contamination of the semiconductor wafer or the glass substrate to be treated should be controlled strictly these days, most of the systems for clamping the semiconductor wafer or the like mechanically as conventional techniques are being replaced with the electrostatic chuck systems that utilize an electrostatic attraction force.

The electrostatic chuck includes a lower insulation layer, an electrode layer and a surface insulation dielectric layer, which are formed on a metal substrate. The surface insulation dielectric layer constitutes an attracting surface for holding the semiconductor wafer or the glass substrate. Then, a high voltage potential is applied externally to the electrode layer via power feeding terminals disposed in through holes formed through the upper and lower surfaces of the metal substrate. Thus, Coulomb force or Johnsen-Rahbeck force is generated between charges distributed on the surface of the surface insulation dielectric layer (i.e., the attracting surface) and the charges polarized and induced by the object to be treated on the attracting surface. Otherwise, a gradient force is generated by the electrostatic field, so that the semiconductor wafer or the like as the object to be treated is attracted and held.

When etching treatment is performed on the semiconductor wafer by using a plasma apparatus, for instance, the temperature of the semiconductor wafer will increase up to approximately 200° C. to 400° C. Therefore, in order to cool down the wafer that is being treated to an appropriate temperature, a refrigerant is made to flow in a conduit line provided inside the metal substrate so that the temperature increase of the wafer is prevented. However, the surface insulation dielectric layer side of the electrostatic chuck is exposed to the high temperature while the temperature on the metal substrate side is kept substantially to be the temperature of the refrigerant. Therefore, a temperature gradient occurs between them. For instance, a temperature gradient of a few hundred degrees at highest occurs between the surface insulation dielectric layer and the lower insulation layer. In addition, as a matter of course, a temperature gradient of a few hundred degrees at highest occurs in the electrostatic chuck itself between the time when the apparatus is operating and the time when the apparatus is stopped.

If a stress such as a heat cycle is applied to the electrostatic chuck, various problems may occur in particular with respect to a power feeding structure for supplying a voltage to the electrode layer. More specifically, since an electric conductor such as the power feeding terminal or the electrode layer has a coefficient of thermal expansion different from that of an insulator such as the lower insulation layer and the surface insulation dielectric layer, a crack may occur easily in the region around the power feeding terminal where the electric conductor and the insulator contact with each other and are structurally complicated. This crack may be a factor causing such problem as a local deterioration in temperature characteristics of the electrostatic chuck or particle generation or the like.

FIGS. 4(a) and 4(b) illustrate a conventional example of the power feeding structure of the electrostatic chuck. A through hole 7 is formed in a metal substrate 1, and a power feeding terminal 3 is disposed in the through hole 7 via an insulation holding member 2. As illustrated in FIG. 4(b), a tip of this power feeding terminal 3 contacts with an electrode layer 5, so that a voltage supplied to the metal substrate 1 from the lower surface side is supplied to the electrode layer 3. Here, the crack as described above is likely to occur at an edge of the portion where the tip of the power feeding terminal 3 contacts with the electrode layer 5 (crack 8a), for instance. In addition, the crack is likely to occur also at a portion where the power feeding terminal 3, the insulation holding member 2, and a lower insulation layer 4 contact with each other (crack 8b).

Therefore, some methods are proposed for reducing the influence of the thermal load that is applied to the electrostatic chuck. For instance, a proposed method includes brazing a power feeding terminal for feeding power to an electrode layer disposed in a ceramic substrate, and providing a hollow portion on an end surface of the power feeding terminal so that a stress relieving member having a coefficient of thermal expansion that is substantially the same as that of the ceramic substrate is inserted in the hollow portion (see Patent Document 1). In addition, another proposed method includes disposing a power feeding terminal in a through hole formed in a substrate made of a metal and ceramic composite material via a casing portion made of a ceramic so that an end surface of the power feeding terminal is flush with the upper surface of the substrate, masking the end surface of the power feeding terminal, forming an insulation layer by thermal spraying treatment, removing the masking so as to expose the end surface of the power feeding terminal, and performing thermal spraying of a metal material so as to form an electrode layer (see Patent Document 2). Further, still another proposed method includes forming a through hole formed through an inner electrode layer of a ceramic substrate from the lower side, forming a metalized layer on the inner wall of the through hole, and brazing a power feeding terminal to be fixed in the through hole (see Patent Document 3).

However, if the power feeding terminal is fixed by brazing as described in Patent Documents 1 and 3, a thermal load is applied to a brazing material itself so that the problem may be more complicated. In addition, the brazing work itself is a manual work and is not completely reliable. On the other hand, according to the method of adjusting the end surface of the power feeding terminal disposed in the substrate to be flush with the upper surface of the substrate, and forming the electrode layer by the thermal spraying treatment so that the end surface of the power feeding terminal contacts with the electrode layer as described in Patent Document 2, the work efficiency may be improved. However, it is necessary to improve the reliability more with respect to the thermal load.

In other words, since the power feeding terminal contacts with the electrode layer by surface contact, there is still a problem remaining in terms of reliability when a thermal load is applied.

Patent Document 1: JP 11-074336 A
Patent Document 2: JP 2003-179127 A
Patent Document 3: JP 10-189696 A

DISCLOSURE OF THE INVENTION

Problem to be Solved by the Invention

The influence of the thermal load applied to the electrostatic chuck is related to a power feeding structure of the electrostatic chuck. Specifically, it relates to a shape of an interface between the power feeding terminal and the electrode layer, and to a manner in which a force is exerted among the metal substrate, the power feeding terminal, the insulation holding member, the lower insulation layer, the electrode layer and the surface insulation dielectric layer when the thermal load is actually applied. A relationship between them has not been studied sufficiently up to date.

Therefore, a task of the present invention is to provide a power feeding structure in which a crack hardly occurs in the lower insulation layer, the electrode layer or the surface insulation dielectric layer by relieving a thermal stress generated in the power feeding structure when the thermal load or a heat cycle is applied to the electrostatic chuck, so as to avoid such problem as a local deterioration in temperature characteristics of the electrostatic chuck or particle generation as much as possible and further to increase a lifetime of the electrostatic chuck.

Means for Solving the Problem

Therefore, it is an object of the present invention to provide a power feeding structure of an electrostatic chuck in which a crack hardly occurs in a lower insulation layer, an electrode layer or a surface insulation dielectric layer. In addition, it is another object of the present invention to provide a method of manufacturing such the power feeding structure of the electrostatic chuck.

Further, it is still another object of the present invention to provide a method of regenerating an electrostatic chuck power feeding structure in which a used electrostatic chuck can be reused effectively by regenerating the power feeding structure of the electrostatic chuck that has been used in various apparatuses.

Specifically, the present invention resides in a power feeding structure of an electrostatic chuck including a lower insulation layer, an electrode layer and a surface insulation dielectric layer formed on an upper surface side of a metal substrate in order from the metal substrate, the power feeding structure including:

a through hole formed through an upper surface and a lower surface of the metal substrate;

a power feeding terminal disposed in the through hole for supplying a voltage supplied from a lower surface side of the metal substrate to the electrode layer formed on the upper surface side of the metal substrate; and an insulation holding member formed of an electric insulating material for insulating an inner wall of the through hole from the power feeding terminal and for holding the power feeding terminal, in which the power feeding terminal includes a power feeding end portion that protrudes to the upper surface side of the metal substrate, and a tip of the power feeding end portion is positioned at an electrode layer side with respect to an interface between the electrode layer and the lower insulation layer, and on and under an interface between the electrode layer and the surface insulation dielectric layer.

The present invention also resides in a method of manufacturing a power feeding structure of an electrostatic chuck including a lower insulation layer, an electrode layer and a surface insulation dielectric layer formed on a upper surface side of a metal substrate in order from the metal substrate, the power feeding structure including:

a through hole formed through an upper surface and a lower surface of the metal substrate;

a power feeding terminal disposed in the through hole for supplying a voltage supplied from a lower surface side of the metal substrate to the electrode layer formed on the upper surface side of the metal substrate; and an insulation holding member formed of an electric insulating material for insulating an inner wall of the through hole from the power feeding terminal and for holding the power feeding terminal, the method including the steps of:

forming the lower insulation layer by thermal spraying of ceramic powder onto the upper surface side of the metal substrate having the through hole in which the power feeding terminal is disposed via the insulation holding member, a part of the power feeding terminal protruding to the upper surface side of the metal substrate;

forming the electrode layer by thermal spraying of metal powder so that a tip of a power feeding end portion of the power feeding terminal protruding to the upper surface side of the metal substrate is embedded or the electrode layer is flush with the tip of the power feeding end portion; and forming the surface insulation dielectric layer by thermal spraying of ceramic powder.

Further, the present invention resides in a method of regenerating a power feeding structure of an electrostatic chuck including a lower insulation layer, an electrode layer and a surface insulation dielectric layer formed on a upper surface side of a metal substrate in order from the metal substrate, the power feeding structure including:

a through hole formed through an upper surface and a lower surface of the metal substrate;

a power feeding terminal disposed in the through hole for supplying a voltage supplied from a lower surface side of the metal substrate to the electrode layer formed on the upper surface side of the metal substrate; and an insulation holding member formed of an electric insulating material for insulating an inner wall of the through hole from the power feeding terminal and for holding the power feeding terminal, the method including the steps of:

removing the surface insulation dielectric layer, the electrode layer and the lower insulation layer from the metal substrate of a used electrostatic chuck;

forming the lower insulation layer by thermal spraying of ceramic powder onto the upper surface side of the metal substrate having the through hole in which the power feeding terminal is disposed via the insulation holding member, a part of the power feeding terminal protruding to the upper surface side of the metal substrate;

forming the electrode layer by thermal spraying of metal powder so that a tip of a power feeding end portion of the power feeding terminal protruding to the upper surface side of the metal substrate is embedded or the electrode layer is flush with the tip of the power feeding end portion; and forming the surface insulation dielectric layer by thermal spraying of ceramic powder.

Note that an object to be treated such as a semiconductor wafer or a glass substrate is placed and attracted on the side of the surface insulation dielectric layer of the electrostatic chuck in the present invention, and that the side of the surface insulation dielectric layer on which the object to be treated is placed is referred to as a upper surface side while the opposite side is referred to as a lower surface side when the upper or lower side of the metal substrate is referred to.

Effects of the Invention

In the power feeding structure of the electrostatic chuck according to the present invention, the tip of the power feeding end portion of the power feeding terminal is positioned at the electrode layer side with respect to the interface between the electrode layer and the lower insulation layer, and on and under the interface between the electrode layer and the surface insulation dielectric layer. Therefore, the power feeding terminal contacts with the electrode layer securely so that the occurrence of a crack can be prevented. In particular, the power feeding end portion of the power feeding terminal is formed like a protrusion including a top surface having a predetermined area at the tip and decreasing its diameter gradually toward the tip. Thus, the stress that is applied to the lower insulation layer can be dispersed, and a crack in the surface insulation dielectric layer, the electrode layer and the lower insulation layer due to a thermal load caused by a heat gradient of the power feeding structure and a thermal load caused by the heat cycle can be suppressed, so that a durable electrostatic chuck can be provided, which can avoid such problem as the local deterioration of the temperature characteristics of the electrostatic chuck or the particle generation as much as possible. In addition, it is possible to increase the lifetime of the electrostatic chuck.

In addition, according to the regeneration method of the electrostatic chuck power feeding structure of the present invention, a used electrostatic chuck can be reused effectively by applying the power feeding structure of the present invention to the electrostatic chuck that has been used in various apparatuses. It is also possible to increase its lifetime.

DESCRIPTION OF SYMBOLS

1: metal substrate, 2: insulation holding member, 3: power feeding terminal, 3a: power feeding end portion, 3b: top surface, 3c: side surface, 4: lower insulation layer, 5: electrode layer, 6: surface insulation dielectric layer, 7: through hole, 8a, 8b: crack, $l_1$: interface between electrode layer and lower insulation layer, $l_2$: interface between electrode layer and surface insulation dielectric layer, x: position of tip of power feeding end portion

BEST MODE FOR CARRYING OUT THE INVENTION

Hereinafter, a preferred embodiment of the present invention is described in detail with reference to the attached drawings.

Figure 1:
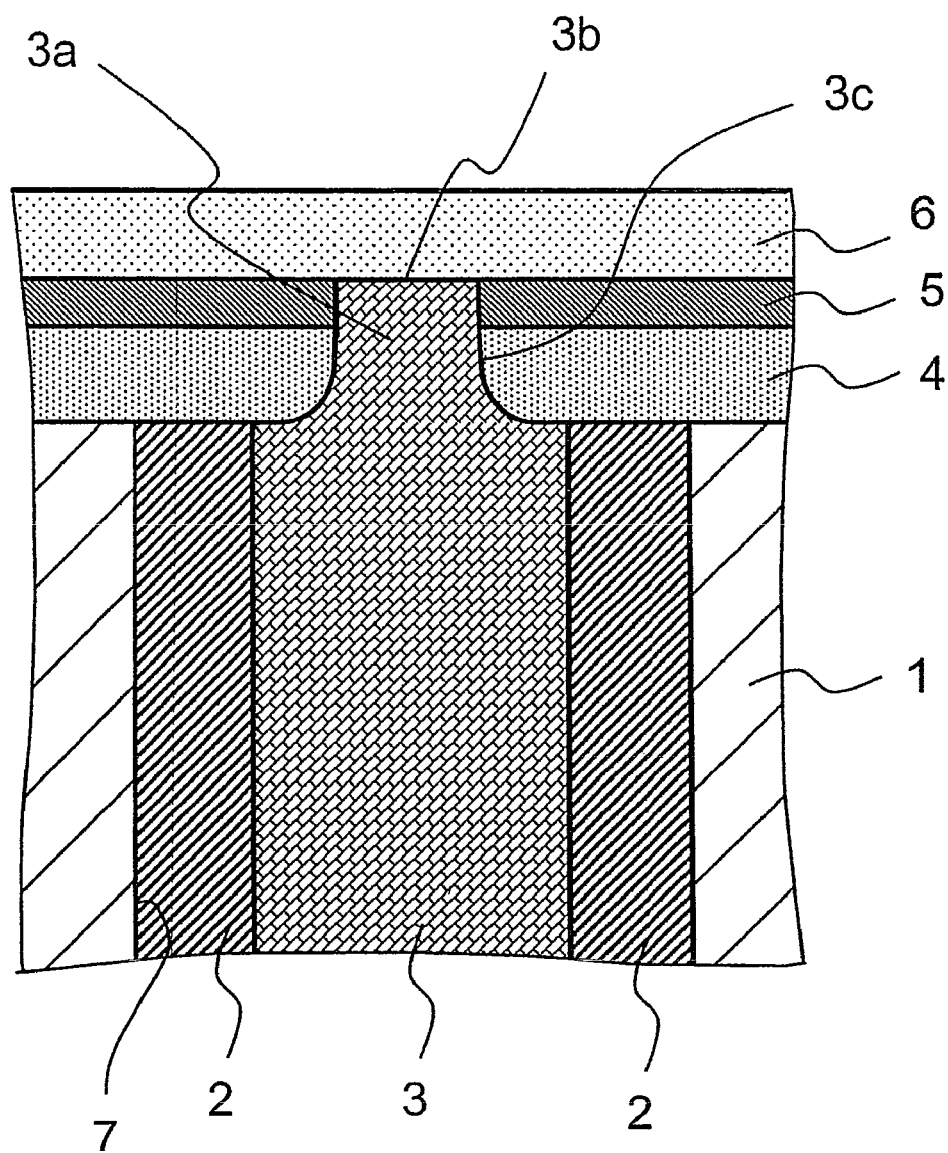
FIG. 1 is a cross sectional explanatory diagram illustrating a power feeding structure of an electrostatic chuck according to the present invention.

First, a power feeding structure of an electrostatic chuck of the present invention is described. FIG. 1 is a cross sectional explanatory diagram illustrating a power feeding structure of the electrostatic chuck, and it is an enlarged view of the power feeding structure of the electrostatic chuck including a lower insulation layer 4, an electrode layer 5 and a surface insulation dielectric layer 6 formed on a upper surface of a metal substrate 1 in order from the metal substrate 1. More specifically, this power feeding structure includes a through hole 7 formed through the upper surface and a lower surface of the metal substrate 1, a power feeding terminal 3 disposed in the through hole 7 so as to supply a voltage supplied from the lower surface side of the metal substrate 1 to the electrode layer 5 formed on the upper surface side, and an insulation holding member 2 formed of an electric insulating material for insulating the inner wall of the through hole 7 from the power feeding terminal 3 and holding the power feeding terminal 2.

Further, the power feeding terminal 3 has a power feeding end portion 3a protruding toward the upper surface side of the metal substrate 1. A tip of this power feeding end portion 3a is positioned on the electrode layer 5 side with respect to the interface between the electrode layer 5 and the lower insulation layer 4, and on and under the interface between the electrode layer 5 and the surface insulation dielectric layer 6. In other words, when the interface between the electrode layer 5 and the lower insulation layer 4 is denoted by $l_1$ while the interface between the electrode layer 5 and the surface insulation dielectric layer 6 is denoted by $l_2$, the position x of the tip of the power feeding end portion 3a satisfies the relational expression "$l_1 < x \leq l_2$" in the present invention.

Figure 2:
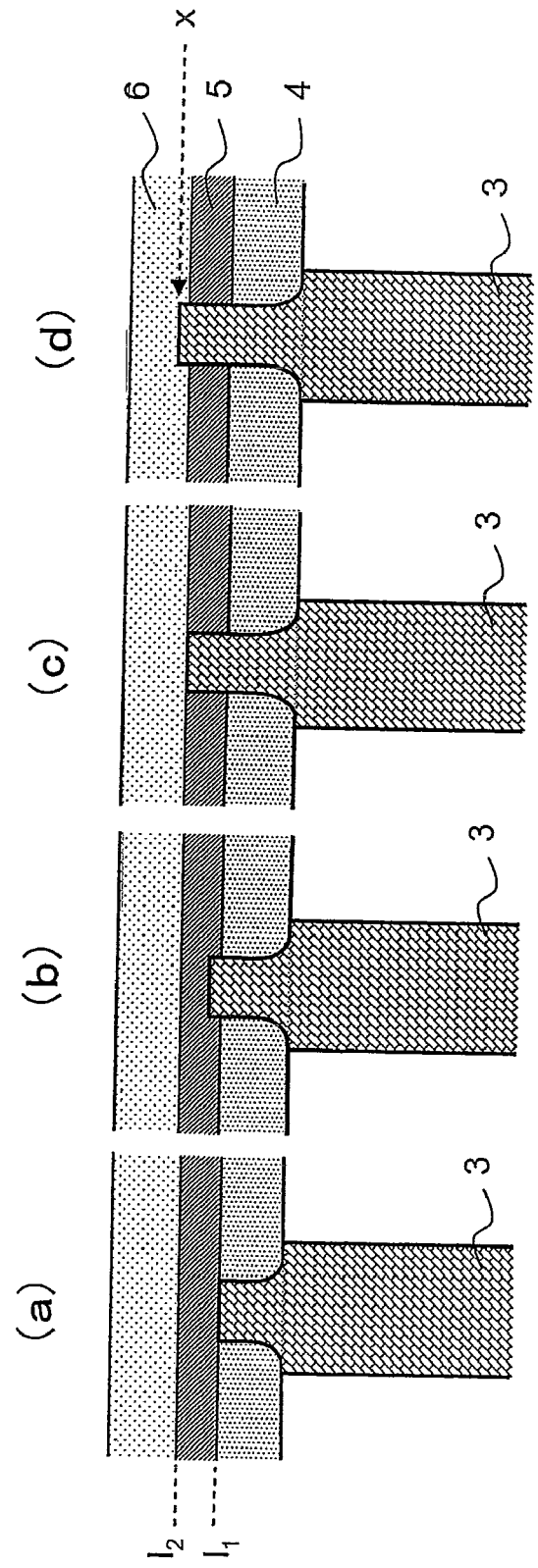
FIG. 2 are cross sectional explanatory diagrams illustrating positional relationships of the tip of the power feeding end portion 3a with respect to the electrode layer.

This relationship is described in detail with reference to FIG. 2. In FIG. 2(a), the position x of the tip of the power feeding end portion 3a is on the interface between the electrode layer 5 and the lower insulation layer 4 ($x=l_1$), and x does not satisfy the above relational expression. On the other hand, in FIG. 2(d), the position x is above the interface between the electrode layer 5 and the surface insulation dielectric layer 6 ($x>l_2$), and x does not satisfy the above relational expression. If the tip of the power feeding end portion 3a reaches the inside of the surface insulation dielectric layer 6, the surface insulation dielectric layer becomes thin at the position, so that there is a possibility that the insulating properties against high voltage cannot be maintained. On the contrary, in FIG. 2(b), the tip of the power feeding end portion 3a is positioned inside the electrode layer 5 ($x>l_1$), and x satisfies the above relational expression. Further, in FIG. 2C, the position x is on the interface between the electrode layer 5 and the surface insulation dielectric layer 6 ($x=l_2$), and x satisfies the above relational expression.

Further, in the present invention, as long as the position x of the tip of the power feeding end portion 3a satisfies the above relational expression, a shape of the tip of the power feeding end portion 3a is not limited to a particular shape. It may have a top surface of a predetermined area or may have a vertex. It is preferable that the power feeding end portion 3a of the power feeding terminal 3 should include a top surface 3b having a predetermined area at the tip thereof and have a protruding shape whose diameter decreases gradually toward the tip. Since the power feeding end portion 3a has the protruding shape and the top surface 3b at the tip thereof, the power feeding terminal 3 contacts securely with the electrode layer 5 so that a possibility of occurrence of a discharge or the like can be eliminated as much as possible. Further, since the power feeding end portion 3a has a diameter decreasing gradually toward the tip, a side surface 3c of the power feeding end portion contacts with the lower insulation layer 4 by a fit-in relationship, so that a stress caused by a thermal load can be dispersed in a relatively wide range for preventing occurrence of a crack. Note that a concrete size of the power feeding terminal 3 depends on a size of the semiconductor wafer or the like to be treated or a shape of the apparatus equipped with the electrostatic chuck, or the like, though an outer diameter thereof is usually (φ2 to φ10 mm. In addition, if the top surface is formed at the tip of the power feeding end portion 3a, it is preferable to have a circular shape having a diameter of 2 to 4.5 mm, for example.

In addition, it is preferable for the side surface 3c of the power feeding end portion that at least the portion contacting with the lower insulation layer 4 is a curved surface having a predetermined curvature. Thus, the above-mentioned effect of dispersing the stress can be enhanced more. Here, a radius of curvature of the curved surface is not limited to a particular value. Although it depends on a length of the power feeding end portion 3a or a size of the top surface formed at the tip thereof, it should be determined from a viewpoint of dispersing the stress or an overall consideration of a contact area with the electrode layer. Specifically, a range of approximately R0.25 to R1.5 mm is preferable, so that a risk of a discharge can be eliminated as much as possible. Note that the shape of the power feeding end portion 3a having a diameter decreasing toward the tip in the present invention means to exclude the case where the power feeding end portion 3a has a diameter increasing toward the tip. In other words, it is allowed to have a part having the same diameter. For instance, as to the power feeding end portion 3a disposed inside the electrode layer 5, its diameter may be the same to the tip.

Next, a manufacturing method for the power feeding structure described above is exemplified while the present invention is further described. First, the metal substrate 1 including the power feeding terminal 3 disposed in the through hole 7 via the insulation holding member 2 is prepared. On this occasion, a part of the power feeding terminal 3 is made to protrude from the upper surface side of the metal substrate 1, so that the power feeding end portion 3a is formed. Then, ceramic powder such as alumina or aluminum nitride is sprayed thermally onto the upper surface side of the metal substrate 1 so as to form the lower insulation layer. Here, a purity of the ceramic powder is preferably within a range of 99.9% to 99.99%. In addition, a film thickness of the lower insulation layer 4 depends on an environment in which the apparatus is used, though it is preferably within a range of 200 to 500 μm in general.

The material of the power feeding terminal 3 is not limited to a particular material, though it is preferable to be metal titanium from a viewpoint of a corrosion resistance. Further, it is sufficient that the metal substrate is a normally used one made of aluminum, copper, stainless steel, various alloys including them, or a metal matrix composite (MMC) of ceramic and metal, for example. In addition, the power feeding terminal 3 and the insulation holding member 2, as well as the insulation holding member 2 and the inner wall of the through hole 7 may be glued to each other, respectively, by using epoxy adhesive or silicon adhesive, for example.

Figure 3:
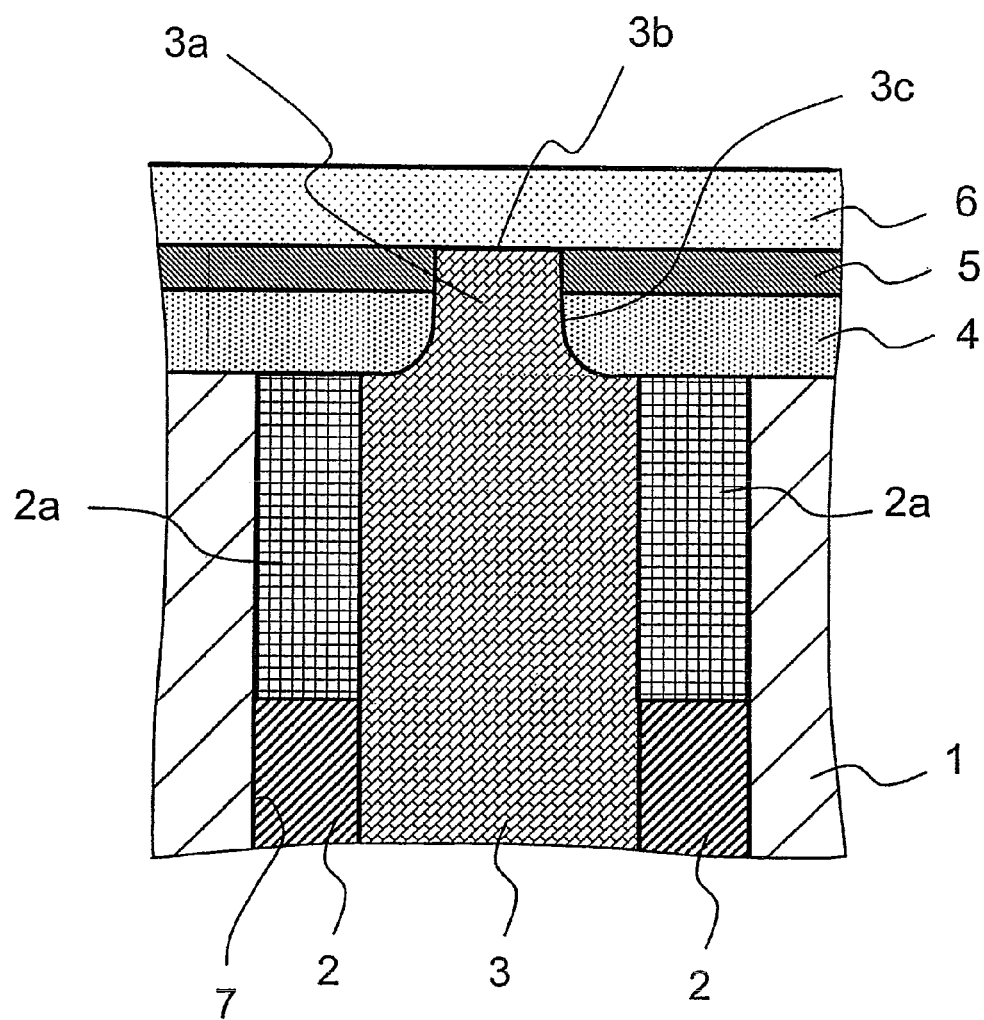
FIG. 3 is a cross sectional explanatory diagram of the power feeding structure in which a part of the insulation holding member (on the side of the lower insulation layer 4) is formed of a porous ceramic.

On the other hand, the material of the insulation holding member 2 may be resin, machinable ceramic, alumina ceramic, alumina ceramic formed by the thermal spray, or the like, for example. It is preferable that at least the part thereof exposed to the upper surface side of the metal substrate should be made of porous ceramic. FIG. 3 illustrates a cross sectional explanatory diagram in the case where a part of the insulation holding member 2 on the side of the lower insulation layer 4 is formed of a porous ceramic 2a. In this way, if the part exposed to the upper surface side of the metal substrate 1 is formed of the porous ceramic, and if the lower insulation layer 4 is formed by the thermal spray of the ceramic powder, the ceramic powder is sprayed thermally into the holes of the porous material so as to form a firm joint portion. Note that the effect obtained when the part on the side of the lower insulation layer 4 is made of the porous ceramic so as to contact with the lower insulation layer can be obtained independently of a position of the tip of the power feeding end portion or the shape of the power feeding terminal. However, if it is combined with the position or the shape of the tip of power feeding end portion according to the power feeding structure of the present invention, the effect of suppressing occurrence of a crack can be enhanced more.

If the power feeding terminal is made of metal titanium, for instance, a coefficient of thermal expansion of titanium is $8.6\times10^{-6}/°$ C., which is usually larger than that of a material forming the lower insulation layer or the electrode layer described later (for example, $6.5\times10^{-6}/°$ C. of alumina, and $4.5\times10^{-6}/°$ C. of tungsten). Therefore, when a thermal load is applied to the power feeding terminal 3, a stress is generated in the direction of the insulation holding member 2. Then, a force of separating the lower insulation layer 4 and the insulation holding member 2 from each other is generated, which may cause a crack. Therefore, as described above, the insulation holding member 2 and the lower insulation layer 4 are made of equivalent materials, and the joint at the interface between them is made firmer, so that occurrence of a crack can be prevented effectively. In addition, a porosity of the porous ceramic is preferably within a range of 0.5% to 30%. In particular, a porosity within a range of 5% to 10% is more preferable for securing continuity with the lower insulation layer 4 easily and from a viewpoint of sealing processability of pores using silicon, epoxy resin, acrylic resin or the like. Further, when the material of the insulation holding member 2 is the porous ceramic, at least only the part contacting with the lower insulation layer 4 may be formed of the porous ceramic as illustrated in FIG. 3. Alternatively, the entire insulation holding member 2 may be formed of the porous ceramic.

Next, metal powder is sprayed thermally onto the lower insulation layer 4 formed as described above so that the electrode layer 5 is formed. On this occasion, the electrode layer 5 is formed so that the position x of the tip of the power feeding end portion 3a of the power feeding terminal 3 protruding to the upper surface side of the metal substrate 1 satisfies the relational expression of "$l_1<x\leq l_2$", i.e., so that the tip of the power feeding end portion 3a is embedded in the electrode layer 5, or so that the tip of the power feeding end portion 3a forms the same plane as the electrode layer 5. There is no particular limitation for the metal powder that is used for forming the electrode layer 5. However, it is preferable to be a refractory metal from a viewpoint of durability or easiness of the thermal spray. Specifically, molybdenum or tungsten is preferably used. A purity of the metal powder to be used is preferably 99.99% or higher. In addition, a film thickness of the electrode layer 5 depends on the environment in which the apparatus is used, but is preferably 20 to 60 μm in general. Note that it is possible to form the electrode layer 5 by applying paste of the refractory metal described above, but this method is inferior to the thermal spray in the viewpoint of durability.

Then, the ceramic powder such as alumina, aluminum nitride or the like is sprayed thermally onto the electrode layer 5 so that the surface insulation dielectric layer 6 is formed. Thus, the electrostatic chuck having the power feeding structure of the present invention can be obtained. A purity of the ceramic powder forming the surface insulation dielectric layer 6 is similar to the case of the lower insulation layer 4. In addition, a film thickness of the surface insulation dielectric layer 6 depends on the environment in which the apparatus is used, but is preferably 200 to 500 μm in general. Further, the surface of the surface insulation dielectric layer 6 for attracting a semiconductor wafer or the like is preferably processed by flattening treatment so that the flatness thereof is within a range of 5 to 10 μm. In addition, the exposed surfaces of the lower insulation layer 4, the electrode layer 5 and the surface insulation dielectric layer 6 may be processed by vacuum impregnation treatment using silicon resin, epoxy resin, or acrylic resin, for example, for a purpose of sealing pores formed by the thermal spray.

In addition, it is possible to utilize the manufacturing method of the power feeding structure of the present invention for regenerating the power feeding structure of a used electrostatic chuck. More specifically, the surface insulation dielectric layer 6, the electrode layer 5 and the lower insulation layer 4 are removed mechanically or chemically from the metal substrate 1 of the used electrostatic chuck, so as to prepare a metal substrate including the power feeding terminal disposed in the through hole and a part of the power feeding terminal protruding to the upper surface side of the metal substrate. Then, the lower insulation layer 4, the electrode layer 5 and the surface insulation dielectric layer 6 are formed similarly to the manufacturing method of the power feeding structure, so that the electrostatic chuck having the power feeding structure of the present invention can be regenerated.

Prior to the step of forming the electrode layer, a height of the power feeding end portion of the power feeding terminal may be adjusted, or it may be shaped to be like a protrusion including a top surface having a predetermined area at the tip thereof and a diameter decreasing gradually toward the tip. In addition, when the surface insulation dielectric layer 6, the electrode layer 5 and the lower insulation layer 4 are removed from the used electrostatic chuck, the insulation holding member 2 may also be removed so as to exchange it with a new one. In this case, at least the part exposed to the upper surface side of the metal substrate 1 may be made of porous ceramic. Note that the used electrostatic chuck includes one that has been used in a certain apparatus for a predetermined period of time and finished its lifetime as a product, and one in which the surface insulation dielectric layer 6 is deteriorated or a crack has occurred due to a certain trouble, or that cannot be used any more due to another damage or wearing out before reaching the lifetime.

Example 1

An example of the electrostatic chuck having the power feeding structure illustrated in FIG. 1 is described. A metal substrate 1 made of aluminum having a diameter of φ230 mm and a thickness of 48 mm was prepared. A upper surface side of this metal substrate 1 has a flatness of 10 μm or smaller. The through hole 7 having a maximum diameter of φ11.1 mm is formed in the metal substrate 1 so as to pierce the upper surface and the lower surface thereof. In addition, a plurality of conduits (not shown) are formed. Some of the conduits are used for cooled water to pass through so as to cool the metal substrate 1 directly while others are used for leading gas such as helium to the underside of the object to be treated such as a semiconductor wafer or the like disposed on the electrostatic chuck.

The power feeding terminal 3 is obtained by machining a titanium material, which has a maximum outer diameter of φ5 mm and a length of 47 mm. In addition, the top surface 3$b$ having a diameter of 3 mm is formed at the tip of the power feeding end portion 3$a$, and the side surface 3$c$ of the power feeding end portion 3$a$ is a curved surface having a radius of curvature R of 1 mm. This power feeding terminal 3 is disposed in the through hole 7 via the insulation holding member 2 made of resin so that the power feeding end portion 3$a$ is formed protruding to the upper surface side of the metal substrate 1 by 350 μm. The power feeding terminal 3 and the insulation holding member 2, as well as the insulation holding member 2 and the inner wall of the through hole 7 are respectively glued to each other by an epoxy adhesive (not shown). Note that an outer diameter of the insulation holding member 2 illustrated in FIG. 1 is 11 mm.

As described above, the power feeding terminal 3 was disposed in the through hole 7, and alumina of a purity of 99.99% was sprayed thermally onto the upper surface side of the metal substrate 1 from which the power feeding end portion 3$a$ of the power feeding terminal 3 was protruded so that the lower insulation layer 4 having a thickness of 300 μm was formed. Next, tungsten of a purity of 99.99% was sprayed thermally for forming the electrode layer 5 having a thickness of 50 μm so as to be the same height as the top surface 3$b$ of the power feeding terminal 3. Note that unnecessary alumina was removed before the step of forming the electrode layer because alumina that had been used for forming the lower insulation layer 4 was deposited on the power feeding terminal 3.

Next, alumina of a purity of 99.99% was sprayed thermally onto the electrode layer 5 so as to form a surface insulation dielectric layer 6 having a thickness of 300 μm. After that, the surface insulation dielectric layer 6 was treated so that its surface flatness would fall within a range of 5 to 10 μm. In addition, the vacuum impregnation treatment was performed using silicon for sealing the exposed surfaces of the lower insulation layer 4, the electrode layer 5 and the surface insulation dielectric layer 6 so that the electrostatic chuck was completed. Note that atmospheric thermal spray was performed as the thermal spray onto the lower insulation layer 4, the electrode layer 5 and the surface insulation dielectric layer 6.

Example 2

Next, an example of the case where the power feeding structure of the used electrostatic chuck is regenerated is described. First, the surface insulation dielectric layer 6, the electrode layer 5, and the lower insulation layer 4 were removed from the used electrostatic chuck by mechanical cutting that included a manual work partially. When the lower insulation layer 4 was removed from the metal substrate 1, the upper surface side of the metal substrate 1 was removed by a thickness within a range of 0.1 to 0.5 mm to obtain the flatness of 10 μm or smaller.

Next, as illustrated in FIG. 1, the power feeding end portion of the power feeding terminal was processed by using a ball end mill, so that the top surface 3$b$ having a diameter of 3 mm was formed at the tip thereof. In addition, the side surface 3$c$ having a radius of curvature of R1 mm was formed. Then, the lower insulation layer 4, the electrode layer 5 and the surface insulation dielectric layer 6 were formed similarly to Example 1 except that a film thickness of the lower insulation layer 4 was made to be 300 μm+α (α corresponds to the thickness by which the upper surface side of the metal substrate 1 was removed), so that the electrostatic chuck having the power feeding structure of the present invention was regenerated. Note that the above-mentioned α is a thickness adjustment amount of the metal substrate between before and after the regeneration. For instance, if the metal substrate is ground to remove a thickness of 0.5 mm, the lower insulation layer 4 is formed as α=0.5 mm. As a result, the capacity of the electrostatic chuck can be made equal between before and after the regeneration.

Example 3

An example of the electrostatic chuck having the power feeding structure illustrated in FIG. 3 is described. The metal substrate 1 and the power feeding terminal 3 that are similar to those of Example 1 were prepared, and the power feeding terminal 3 was disposed in the through hole 7 of the metal substrate 1 via the insulation holding member 2. On this occasion, the insulation holding member 2a made of alumina having a porosity of 5-10% was used for the lower insulation layer 4 side. This insulation holding member 2a made of alumina is made of the same material as that of the lower insulation layer 4 to be formed later, and has an outer diameter of 11 mm and a length of 10 mm. Other conditions were the same as Example 1.

Next, alumina powder having a purity of 99.99% was sprayed thermally onto the upper surface side of the metal substrate 1 from which the insulation holding member 2a made of alumina is exposed, so that the lower insulation layer 4 having a film thickness of 300 μm was formed. On this occasion, apart of the lower insulation layer 4 contacted with the insulation holding member 2a made of alumina so as to form a firm joint surface. After that, similarly to Example 1, the electrostatic chuck having the power feeding structure of the present invention was completed.

Example 4

Figure 4:
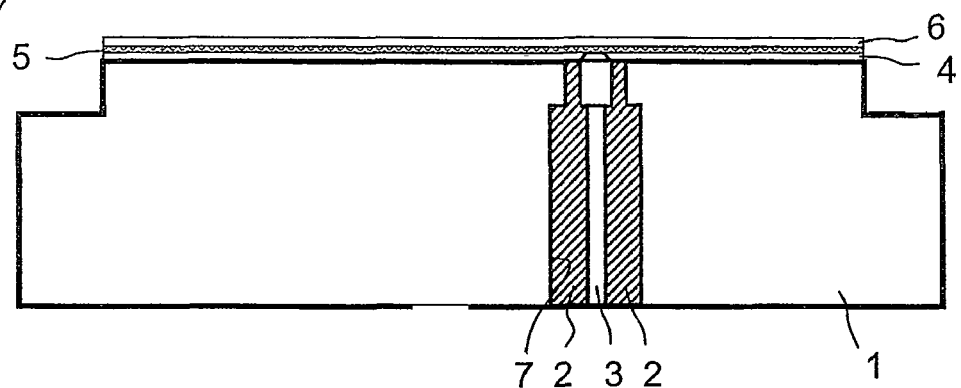
FIG. 4(a) is a cross sectional explanatory diagram of a conventional electrostatic chuck.
FIG. 4(b) is a (partial) enlarged view of a power feeding structure.
Figure 4:
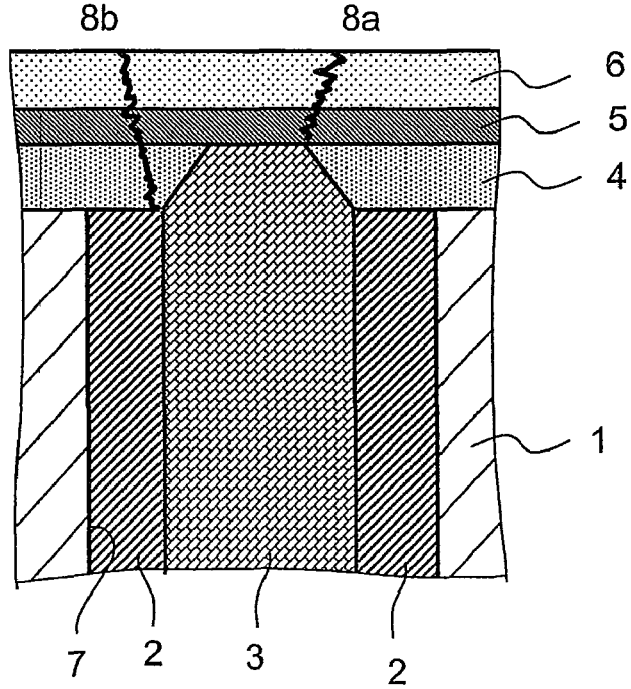

An example of regenerating the electrostatic chuck having the power feeding structure illustrated in FIG. 3 by using the electrostatic chuck of the conventional example illustrated in FIG. 4 is described.

First, similarly to Example 2, the surface insulation dielectric layer 6, the electrode layer 5, and the lower insulation layer 4 were removed from the used electrostatic chuck. After that, the used power feeding terminal and the used insulation holding member were removed from the through hole 7 of the metal substrate 1. Next, the upper surface side of the metal substrate 1 was ground to remove a thickness within a range of 0.1 to 0.5 mm to obtain the flatness of 10 μm or smaller. In addition, similarly to Example 2, the power feeding end portion of the power feeding terminal was processed by the ball end mill so as to form the top surface 3b having a diameter of 3 mm at the tip. In addition, the curved surface 3c having a radius of curvature of R1 mm was formed on the side surface.

Then, the power feeding terminal was disposed in the through hole 7 of the metal substrate 1 via the insulation holding member 2. On this occasion, the insulation holding member 2a made of alumina having a porosity of 5% to 10% was used for the lower insulation layer 4 side. This insulation holding member 2a made of alumina is made of the same material as that of the lower insulation layer 4 to be formed later, and has an outer diameter of 11 mm and a length of 10 mm. Other conditions were the same as Example 1.

Next, alumina powder having a purity of 99.99% was sprayed thermally onto the upper surface side of the metal substrate 1 from which the insulation holding member 2a made of alumina was exposed, so that the lower insulation layer 4 was formed with a film thickness of 300 μm+α (α corresponds to a thickness by which the upper surface side of the metal substrate 1 was removed). On this occasion, a part of the lower insulation layer 4 contacted with the insulation holding member 2a made of alumina so as to form a firm joint surface. Subsequent processes were performed similarly to Example 1 to regenerate the electrostatic chuck having the power feeding structure of the present invention.

INDUSTRIAL APPLICABILITY

According to the present invention, it is possible to provide the power feeding structure in which a crack hardly occurs in the lower insulation layer, the electrode layer or the surface insulation dielectric layer by relieving a thermal stress generated in the power feeding structure when a thermal load or a heat cycle is applied to the electrostatic chuck. Therefore, it is possible to avoid such problem as a local deterioration in temperature characteristics of the electrostatic chuck or particle generation as much as possible and further to increase a lifetime of the electrostatic chuck. Therefore, not only manufacturing of a new electrostatic chuck but also regeneration of an electrostatic chuck having the power feeding structure of the present invention is possible by utilizing a used electrostatic chuck. Thus, the used electrostatic chuck, which has been discarded in some cases conventionally, can be reused effectively. In addition, without limiting to the power feeding structure of the electrostatic chuck in particular, the present invention can be applied also to the power feeding structure of other device such as an engine of an automobile, a high heat furnace, or an electric power turbine, to which a similar thermal load or a similar mechanical load may be applied.

The invention claimed is:

1. A power feeding structure of an electrostatic chuck including a lower insulation layer, an electrode layer and a surface insulation dielectric layer formed on an upper surface side of a metal substrate in order from the metal substrate, the power feeding structure comprising:
   a through hole formed through an upper surface and a lower surface of the metal substrate;
   a power feeding terminal disposed in the through hole for supplying a voltage supplied from a lower surface side of the metal substrate to the electrode layer formed on the upper surface side of the metal substrate; and
   an insulation holding member formed of an electric insulating material for insulating an inner wall of the through hole from the power feeding terminal and for holding the power feeding terminal,
   wherein the power feeding terminal includes a power feeding end portion that protrudes to the upper surface side of the metal substrate, and a tip of the power feeding end portion is positioned at an electrode layer side with respect to an interface between the electrode layer and the lower insulation layer, and on and under an interface between the electrode layer and the surface insulation dielectric layer.

2. A power feeding structure of an electrostatic chuck according to claim 1, wherein the power feeding end portion of the power feeding terminal includes a top surface having a predetermined area at the tip and has a protruding shape whose diameter decreases gradually toward the tip.

3. A power feeding structure of an electrostatic chuck according to claim 2, wherein a side surface of the power feeding end portion of the power feeding terminal that contacts with at least the lower insulation layer is a curved surface having a predetermined curvature.

4. A power feeding structure of an electrostatic chuck according to claim 1, wherein the power feeding terminal is made of metal titanium.

5. A power feeding structure of an electrostatic chuck according to claim 1, wherein at least a part of the insulation holding member exposed to the upper surface side of the metal substrate is made of porous ceramic, and ceramic powder is sprayed thermally so that the lower insulation layer contacts with the porous ceramic.

6. A method of manufacturing a power feeding structure of an electrostatic chuck including a lower insulation layer, an electrode layer and a surface insulation dielectric layer formed on a upper surface side of a metal substrate in order from the metal substrate, the power feeding structure including:
   a through hole formed through an upper surface and a lower surface of the metal substrate;
   a power feeding terminal disposed in the through hole for supplying a voltage supplied from a lower surface side of the metal substrate to the electrode layer formed on the upper surface side of the metal substrate; and
   an insulation holding member formed of an electric insulating material for insulating an inner wall of the through hole from the power feeding terminal and for holding the power feeding terminal,
   the method comprising the steps of:
   forming the lower insulation layer by thermal spraying of ceramic powder onto the upper surface side of the metal substrate having the through hole in which the power feeding terminal is disposed via the insulation holding member, a part of the power feeding terminal protruding to the upper surface side of the metal substrate;
   forming the electrode layer by thermal spraying of metal powder so that a tip of a power feeding end portion of the power feeding terminal protruding to the upper surface side of the metal substrate is embedded or the electrode layer is flush with the tip of the power feeding end portion; and
   forming the surface insulation dielectric layer by thermal spraying of ceramic powder.

7. A method of manufacturing a power feeding structure of an electrostatic chuck according to claim 6, wherein at least a part of the insulation holding member exposed to the upper surface side of the metal substrate is made of porous ceramic, and the lower insulation layer is formed so as to contact with the porous ceramic.

8. A method of regenerating a power feeding structure of an electrostatic chuck including a lower insulation layer, an electrode layer and a surface insulation dielectric layer formed on a upper surface side of a metal substrate in order from the metal substrate, the power feeding structure including:
   a through hole formed through an upper surface and a lower surface of the metal substrate;
   a power feeding terminal disposed in the through hole for supplying a voltage supplied from a lower surface side of the metal substrate to the electrode layer formed on the upper surface side of the metal substrate; and
   an insulation holding member formed of an electric insulating material for insulating an inner wall of the through hole from the power feeding terminal and for holding the power feeding terminal,
   the method comprising the steps of:
   removing the surface insulation dielectric layer, the electrode layer and the lower insulation layer from the metal substrate of a used electrostatic chuck;
   forming the lower insulation layer by thermal spraying of ceramic powder onto the upper surface side of the metal substrate having the through hole in which the power feeding terminal is disposed via the insulation holding member, a part of the power feeding terminal protruding to the upper surface side of the metal substrate;
   forming the electrode layer by thermal spraying of metal powder so that a tip of a power feeding end portion of the power feeding terminal protruding to the upper surface side of the metal substrate is embedded or the electrode layer is flush with the tip of the power feeding end portion; and
   forming the surface insulation dielectric layer by thermal spraying of ceramic powder.

9. A method of regenerating a power feeding structure of an electrostatic chuck according to claim 8, further comprising the step of processing the power feeding end portion of the power feeding terminal so as to include a top surface having a predetermined area on the tip and to have a protruding shape whose diameter decreases toward the tip, prior to the step of forming the electrode layer.

* * * * *